United States Patent [19]
Torreno, Jr.

[11] 3,988,763
[45] Oct. 26, 1976

[54] ISOLATION JUNCTIONS FOR SEMICONDUCTORS DEVICES

[75] Inventor: Manuel L. Torreno, Jr., Elnora, N.Y.

[73] Assignee: General Electric Company, Schenectady, N.Y.

[22] Filed: Mar. 10, 1975

[21] Appl. No.: 556,726

Related U.S. Application Data

[63] Continuation of Ser. No. 411,012, Oct. 30, 1973, abandoned.

[52] U.S. Cl. .................. 357/48; 357/60; 357/88; 357/89; 357/90; 148/1.5
[51] Int. Cl.² .............. H01L 27/04; H01L 29/04; H01L 7/00
[58] Field of Search ............... 357/60, 48, 88, 89, 357/90

[56] References Cited
UNITED STATES PATENTS

| | | | |
|---|---|---|---|
| 2,813,048 | 11/1957 | Pfann | 357/60 |
| 3,617,399 | 11/1971 | Fowler | 357/60 |
| 3,624,467 | 11/1971 | Bean et al. | 357/60 |
| 3,656,028 | 4/1972 | Langdon | 357/60 |
| 3,769,105 | 10/1973 | Chen et al. | 357/60 |

*Primary Examiner*—Edward J. Wojciechowicz
*Attorney, Agent, or Firm*—Donald M. Winegar; Joseph T. Cohen; Jerome C. Squillaro

[57] ABSTRACT

Isolation junctions in semiconductor devices are formed by selected regions of specified conductivity wherein each region has a substantially uniform thickness and resistivity throughout the region. The material of the selected regions is recrystallized semiconductor material with solid solubility of the dopant impurity.

28 Claims, 5 Drawing Figures

U.S. Patent    Oct. 26, 1976    3,988,763
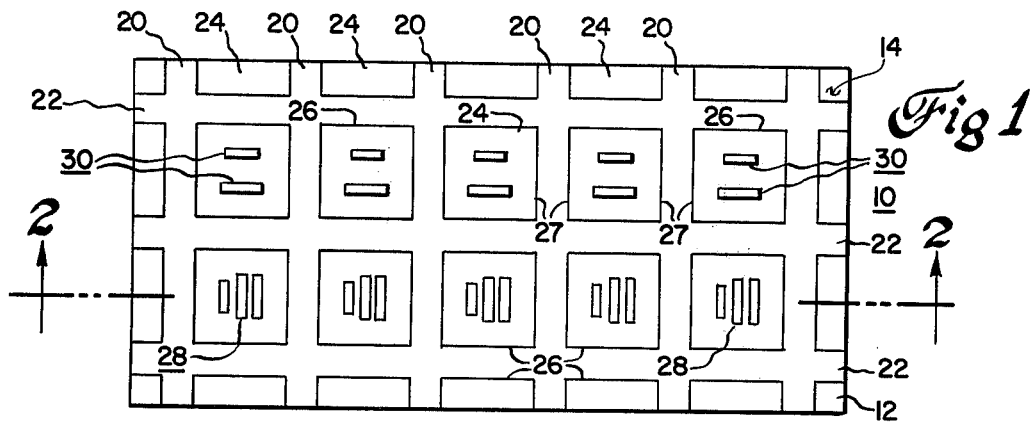
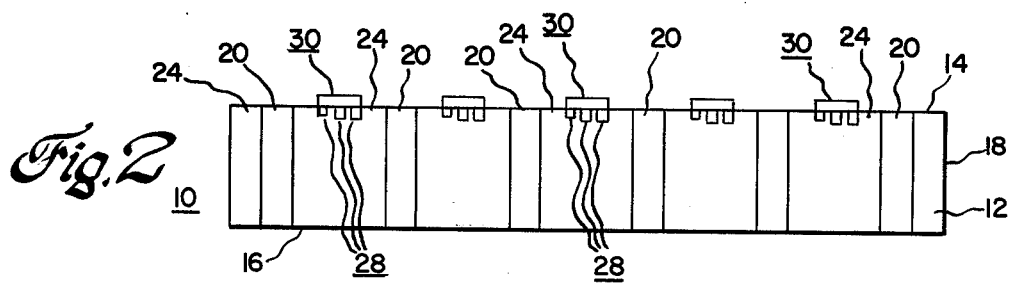
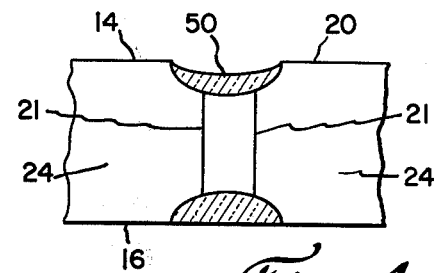
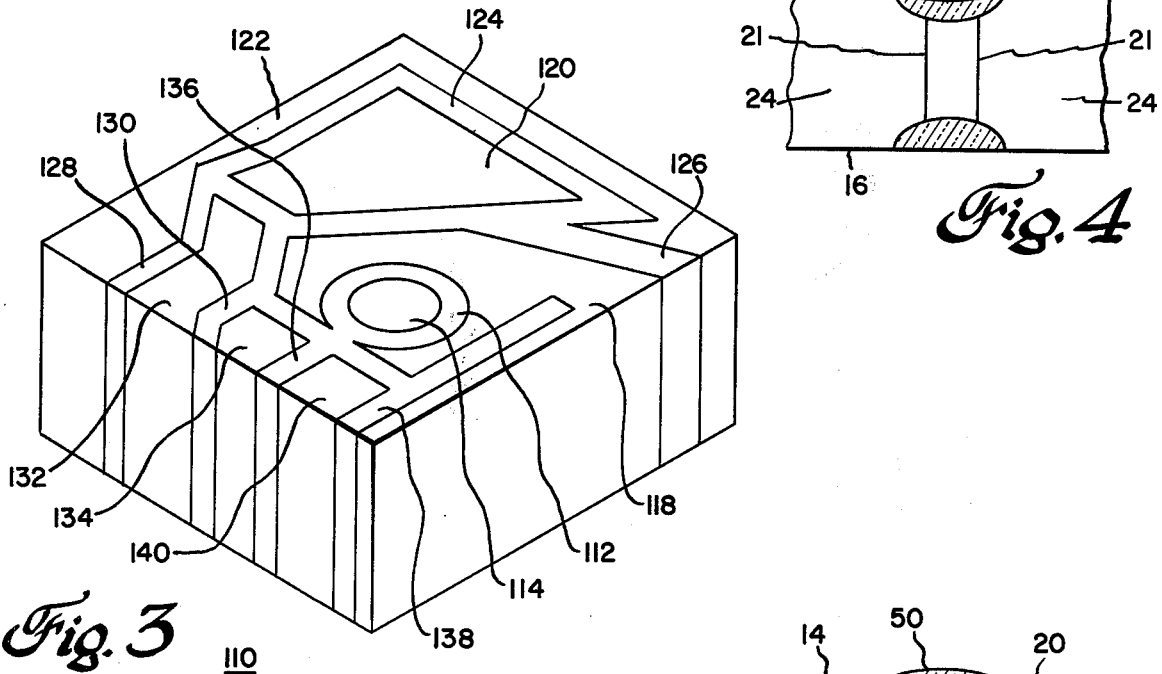
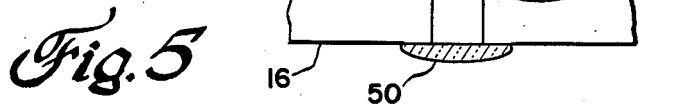

ISOLATION JUNCTIONS FOR SEMICONDUCTORS DEVICES

This is a continuation of application Ser. No. 411,012, filed Oct. 30, 1973, now abandoned.

BACKGROUND OF THE INVENTION

1. Field of the Invention

This invention relates to isolation junctions for semiconductor devices.

2. Background of the Invention

Integrated circuits and related semiconductor devices depend on electrical isolation of one component from another. The most common isolation technique for devices made in the same semiconductor wafer is a diffused region of conductivity type which is opposite to that of the bulk of the device. This results in back-to-back P-N junctions interposed between the devices. This process is usually accomplished by solid state diffusion of selected impurities in a pattern between the devices requiring isolation. The diffused isolation regions are tapered with the widest portion being at the surface through which the diffusion operation is performed. Consequently, the available surface area for component manufacture is reduced in size. Additionally, the diffused regions do not have a constant resistivity throughout the diffused region and the resulting P-N junctions formed thereby are not always a step junction. Occasionally, deep electrical isolation junctions require diffusion of impurities through opposed surfaces of the device. This requires extra process steps. In any instance, however, junction isolation of such devices requires high temperatures and extended furnace times such, for example, as 1250° C for 3 days. High carrier lifetime and crystalline perfection of substrate material are degraded in spite of extensive efforts made to preserve them. Sideways diffusion during formation of the isolation junctions wastes a large volume of the substrate which could be used for device fabrication.

Other electrical isolation techniques involves selective etching of the substrate material of the device and growing or depositing silicon oxide in the etched portion of the substrate.

An object of this invention is to provide a new and improved junction isolation means in semiconductor devices which overcome the deficiencies of the prior art.

Another object of this invention is to provide a new and improved junction isolation means in a semiconductor device which optimizes the volume of substrate material available for device and circuit fabrication.

Another object of this invention is to provide a new and improved junction isolation means in a semiconductor device wherein the isolation region is substantially uniform in thickness and resistivity throughout the region.

A further object of this invention is to provide a new and improved junction isolation means in a semiconductor device wherein post diffusion of the P-N junction is practiced to alter the step junction to a graded junction.

In accordance with the teachings of this invention there is provided a semiconductor device comprising a body of semiconductor material having a selected resistivity, a first type conductivity, two major opposed surfaces forming the top and bottom surfaces of the body and a peripheral side surface. At least one region of second and opposite type conductivity is disposed in the body and extends between, and terminates in, the top and bottom surfaces of the body. The material of at least one region of second type conductivity is recrystallized semiconductor material of the body and has a dopant impurity therein, the concentration of which is sufficient to impart the second type conductivity. The recrystallized material has solid solubility of the impurity contained therein. At least one region divides the body into at least two regions of first type conductivity which are electrically isolated from each other. Each region of first type conductivity has top and bottom surfaces which are coextensive with the respective top and bottom surfaces of the body. A P-N junction is formed by the contiguous surfaces of each pair of regions of opposite type conductivity and is an isolation junction for the body. The P-N junction, formed as the result of the thermal gradient zone melting process is a step junction. In particular, the thermal migration of aluminum "wires" through a body of N-type silicon will produce the desired structure.

A configuration which is preferred for isolation means between semiconductor memory arrays and for the manufacture of individual chips embodies two groups of planar regions of second type conductivity in a body of material of a first type conductivity. The arrangement of the two groups is such as to present an egg crate configuration in the body.

A post thermal gradient zone melting heat treatment is practiced on the step junction to provide a graded P-N junction as required.

As required, electrical passivating material is disposed on selective surface areas of the body and exposed P-N junctions contained therein.

DESCRIPTION OF THE DRAWINGS

FIG. 1 is a top planar view of a semiconductor device embodying the isolation junctions of this invention, and FIG. 2 is an elevation view, in cross-section, of the device in FIG. 1 taken along the cutting planes II—II.

FIG. 3 is an isometric view of a body of semiconductor material embodying isolation junctions made in accordance with the teachings of this invention.

FIGS. 4 and 5 are partial views, in cross-section, of alternate means for passivating exposed portions of isolation junctions of this invention.

DESCRIPTION OF THE INVENTION

Referring to FIGS. 1 and 2 there is shown a semiconductor device 10 comprising a body 12 of semiconductor material having a selected resistivity and a first type conductivity. The semiconductor material comprising the body 12 may be silicon, germanium, silicon carbide, a compound of a Group II element and a Group VI element and a compound of a Group III and a Group V element. The body 12 has two major surfaces 14 and 16, which define the top and bottom surfaces thereof respectively, and a peripheral side surface 18.

A plurality of first spaced planar regions 20 are disposed in the body 12 substantially parallel to each other. Preferably, each of the regions 20 is oriented substantially perpendicular to the top and bottom surfaces, 14 and 16 respectively, and the peripheral side surface 18. Each of the regions 20 has a peripheral side surface which is coextensive with the respective surfaces 14, 16 and 18 of the body 12. A P-N junction 21 is formed by the contiguous surfaces of each region 20 and the immediately adjacent material of the body 12.

A plurality of second spaced planar regions 22 are disposed in the body 12 substantially parallel to each other. Preferably, each of the regions 22 is oriented substantially perpendicular to the respective top and bottom surfaces, 14 and 16 and the side surface 18. In addition, each of the regions 22 is perpendicular to, and intersects, the plurality of first spaced planar regions 20. Each of the second planar regions 22 has a peripheral side surface which is coextensive with the surfaces 14, 16 and 18 of the body 12. A P-N junction 26 is formed by the contiguous surfaces of each region 22 and the immediately adjacent material of the body 12. The intersecting planar regions 20 and 22 define an egg crate configuration which divides the body 12 into a plurality of third regions 24 of first type conductivity.

Preferably, each of the regions 20 and 22 are of the same type conductivity, the conductivity being of a second, and opposite type, than that conductivity of the body 12 and the regions 24. Temperature gradient zone melting is the preferred process means for forming the regions 20 and 22 in the body 12. The material of the planar regions 20 and 22 comprises recrystallized material of the body 12 having a concentration of an impurity constituent which imparts the second, and opposite type, conductivity thereto. It is recrystallized material with solid solubility of the impurity. It is not a recrystallized material with liquid solubility of the impurity. Neither is it a eutectic material in the recrystallized material and it is not an alloy of the impurity and the semiconductor material. Each of the planar regions 20 and 22 has a substantially uniform resistivity throughout its entire region. The width of each of the regions 20 and 22 is substantially constant over the entire region and is determined by whatever photomasking geometry is used to define the regions 20 and 22. In particular the body 12 is of silicon semiconductor material of N-type conductivity and the regions 22 and 24 are aluminum doped recrystallized silicon to form the required P-type conductivity regions. For a complete description of how the planar regions 20 and 22 are formed in the body 12 attention is drawn to the copending application of Thomas R. Anthony and Harvey E. Cline entitled Thermomigration of Metal-Rich Liquid Wires Through Semiconductor Materials filed on the same day as this invention, assigned to the same assignee as this invention and having the Ser. No. 411,018.

The P-N junctions 21 and 26 are well defined and show an abrupt transition from one region of conductivity to the next adjacent region of opposite type conductivity. The abrupt transition produces a step P-N junction.

The plurality of planar regions 20 and 22 electrically isolate each region 24 from all of the remaining regions 24 by the back-to-back relationship of the respective segments of the P-N junctions 21 and 26. The electrical isolation achieved by this novel egg crate design enables one to associate one or more semiconductor devices with one or more of the plurality of regions 24 of first type conductivity. The devices may be planar semiconductor devices 28 formed in mutually adjacent regions 24 and/or mesa semiconductor devices 30 formed on mutually adjacent regions 24 and still protect the electrical integrity of each device 28 or 30 without disturbing the mutually adjacent devices. Devices 28 and 30 may, however, be electrically interconnected to produce integrated circuits and the like.

The spaced planar regions 20 and 22 besides offering excellent electrical isolation between mutually adjacent regions 24 have several other distinct advantages over prior art electrical isolation regions. Each of the regions 20 and 22 have a substantially constant uniform width and a substantially constant uniform impurity concentration for its entire length. In addition, the planar regions 20 and 22 may be fabricated before or after the fabrication of the basic devices 28 and 30. Preferably, the regions 20 and 22 are fabricated after the highest temperature process step necessary for the fabrication of the devices 28 and 30 has been practiced first. This preferred practice limits, or substantially eliminates, any sideways diffusion of the impurity of the regions 20 and 22 which tends to increase the width of the regions 20 and 22 and thereby decrease the abruptness of the P-N junction and the transition between the opposite type conductivity regions. However, should a graded P-N junction be desired, a post "wire" migration heat treatment may be practiced for a time sufficient to obtain the desired width of a graded P-N junction. Further, the planar regions 20 and 22 maximize the volume of the body 12 which can be utilized for functional electrical devices to a greater extent than can be achieved by prior art devices.

The planar regions 20 and 22 shown and described as isolation junction means most likely will find extensive use in integrated circuit fabrication and the like. However, such preferred geometry of the isolation junction is not the only configuration for such isolation junction means. Referring now to FIG. 3 there is shown a semiconductor device 110 embodying a plurality of isolation junction means also made in accordance with the teachings of this invention. Isolation junction means may be toroidal as indicated by the region 112 of second type conductivity which electrically isolates a region 114 of first type conductivity from region 118 of first type conductivity. Regions 120 and 122 of first type conductivity are electrically isolated from each other by a region 124 of second and opposite type conductivity. Regions 126 of second type conductivity electrically isolates a selected portion of the region 122 from the region 118. Regions 128 and 130 of second type conductivity electrically isolate a region 132 of first type conductivity from a selected portion of the region 122 and a region 134, both being of first type conductivity. Regions 136 and 138 of second type conductivity electrically isolate a region 140 of first type conductivity from a selected portion of the region 198. Region 142 of second type conductivity is integral with the regions 112, 124, 130, 136 and 138 and electrically isolates selected portions of the region 118 from regions 132, 134, and 140 and 112 from 140. The device 110 thus illustrates that isolation junction means need not always be perpendicular or parallel to each other or of any specific geometric shape.

A thorough discussion of the migration of metal "wires" relative to orientation on a plane of semiconductor material and the axis of migration is found in a copending application Method of Making Isolation Grids in Bodies of Semiconductor Material, Ser. No. 411,022, filed on the same day as this application for Letters Patent and assigned to the same assignee of this invention.

It may be necessary to protect the exposed portions of the P-N junctions 21 of the device 10 in order to prevent leakage currents from shunting the P-N junctions 21 and deleteriously affecting the device 10. Referring to FIGS. 4 and 5, two suitable methods are shown for protecting the exposed ends of the P-N junctions 21 of the device 10. In FIG. 4, selective etching is employed to etch away a portion of the surfaces 14 and 16 in the vicinity of a region 20 and the associated P-N junctions 21 to provide a trough-like depression in the surfaces 14 and 16. A layer 50 of a passivating material such, for example, as silicon oxide, silicon nitride, phosphosilicate glass, borosilicate glass and the like, is disposed within the etched surface areas 14 and 16 on selected surface areas thereof and the exposed portions of the P-N junctions 21. The layer 50 may be of a sufficient thickness to control current leakage and still not fill the etched out surface area of surface 14 or it may be of a sufficient thickness to completely fill the etched out surface area as shown relative to surface 16.

Referring now to FIG. 5, the surface areas 14 and 16 need not be selectively etched prior to the surface passivation process. The layer 50 of passivation material is disposed on selected areas of the surfaces 14 and 16 and the exposed P-N junctions 21 in the selected areas.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The thermomigration of metal wires is preferably practiced in accordance with the planar orientations, thermomigration directions, stable wire directions and stable wire sizes of Table I.

Table I

| Wafer Plane | Migration Direction | Stable Wire Directions | Stable Wire Sizes |
|---|---|---|---|
| (100) | <100> | <011>* | 100 microns |
|  |  | <0$\bar{1}$1>* | 100 microns |
| (110) | <110> | <1$\bar{1}$0>* | 150 microns |
| (111) | <111> | (a) <01$\bar{1}$> |  |
|  |  | <10$\bar{1}$> | 500 microns |
|  |  | <1$\bar{1}$0> |  |
|  |  | (b) <11$\bar{2}$>* |  |
|  |  | <$\bar{2}$11>* | 500 microns |
|  |  | <1$\bar{2}$1>* |  |
|  |  | (c) Any other* Direction in (111) plane* | 500 microns |

The stability of the migrating wire is sensitive to the alignment of the thermal gradient with the <100>, <110> and <111> axis, respectively.
+Group a is more stable than group b which is more stable than group c.

I claim as my invention:
1. A semiconductor device comprising
a body of semiconductor material having a predetermined level of resistivity, a first type conductivity, two major opposed surfaces comprising, respectively, the top and bottom surfaces thereof and a peripheral side surface;
at least one of the major opposed surfaces having a preferred planar crystal orientation which is one selected from the group consisting of (111), (110) and (100);
a vertical axis which is substantially aligned parallel with a first crystal axis of the material of the body;
at least one region of second and opposite type conductivity, and having opposed end surfaces, disposed in the body and extending between, and terminating in, the top and bottom surfaces of the body, each end surface being coextensive with a respective one of the opposed major surfaces;
the material of the at least one region consisting of recrystallized semiconductor material of the body formed in situ in the body by the migration of a melt of metal-rich semiconductor material of the body through the entire body, from one opposed major surface to the other, by thermal gradient zone melting at a predetermined elevated temperature along a thermal gradient substantially parallel with the first preferred crystal axis and the vertical axis of the body, and having a substantially uniform distribution of the metal throughout the entire region, the level of concentration of the metal being determined by the solid solubility limit of that metal in that semiconductor material at that predetermined elevated temperature of migration, the metal comprising at least one dopant impurity material to impart the second type conductivity and level of resistivity to the region;
the at least one region dividing the body into at least two regions, each having first type conductivity, electrically isolated from one another;
each end surface of each at least one region being coextensive with only one respective major opposed surface of the body;
each of the at least one region of second type conductivity being oriented in a preferred direction which is substantially parallel with a second preferred crystal axis of the material of the body, and
a plurality of P-N junctions, each P-N junction being formed by the contiguous surfaces of the materials of the mutually abutting regions of opposite type conductivity.
2. The semiconductor device of claim 1 wherein each of the at least one region of second type conductivity has a substantially uniform width throughout the region.
3. The semiconductor device of claim 2 wherein each of the P-N junctions is a step junction.
4. The semiconductor device of claim 2 wherein at least two of P-N junctions are a graded junction.
5. The semiconductor device of claim 1 wherein one of the at least one regions of second conductivity has a toroidal configuration.
6. The semiconductor device of claim 1 wherein the at least one region of second conductivity includes two groups of spaced planar regions, each region in each group is disposed in the body substantially perpendicular to the top and bottom surfaces of the body and parallel to the other regions in its group and having a peripheral side surface coextensive with a selective portion of the top, bottom and peripheral side surfaces of the body and each of the regions in one group being substantially perpendicular to and intersecting at least one of the regions of the other group to form a plurality of regions of first type conductivity electrically isolated from each other by respective regions of second type conductivity.
7. The semiconductor device of claim 6 wherein the material of the body is one selected from the group consisting of silicon, silicon carbide, germanium and gallium arsenide.
8. The semiconductor device of claim 6 wherein the opposed major surfaces have a preferred planar crystal orientation of (100) and the second crystal axis is one selected from the group consisting of <011> and <0$\bar{1}$1>.

9. The semiconductor device of claim 8 wherein the semiconductor material of the body is one selected from the group consisting of silicon, germanium, silicon carbide and gallium arsenide.

10. The semiconductor device of claim 6 wherein the opposed major surfaces have a preferred planar crystal orientation of (100) and the second crystal axis is <1$\bar{1}$0>.

11. The semiconductor device of claim 10 wherein the material of the body is silicon, silicon carbide, germanium and gallium arsenide.

12. The semiconductor device of claim 6 wherein the opposed major surfaces have a preferred planar crystal orientation of (111) and the second crystal axis is one selected from the group consisting of <01$\bar{1}$>, <10$\bar{1}$>, <1$\bar{1}$0>, <11$\bar{2}$>, <$\bar{2}$11> and <1$\bar{2}$1>.

13. The semiconductor device of claim 12 wherein the material of the body is one selected from the group consisting of silicon, silicon carbide, germanium and gallium arsenide.

14. The semiconductor device of claim 6 wherein each of the regions of second type conductivity has a substantially uniform width throughout the region.

15. The semiconductor device of claim 14 wherein the P-N junctions are step junctions.

16. The semiconductor device of claim 14 wherein at least two of the P-N junctions are graded junctions.

17. The semiconductor device of claim 15 wherein the material of the body is silicon.

18. The semiconductor device of claim 14 wherein the material of the body is silicon.

19. The semiconductor device of claim 6 wherein the material of the body is silicon having N-type conductivity and each of the second regions has P-type conductivity.

20. The semiconductor device of claim 14 wherein N-type conductivity, and each of the second regions has P-type conductivity.

21. The semiconductor device of claim 20 including at least one electrical device fabricated in one of the plurality of regions of first type conductivity.

22. The semiconductor device of claim 1 wherein the material of the body is one selected from the group consisting of silicon, silicon carbide, germanium and gallium arsenide.

23. The semiconductor device of claim 1 wherein the opposed major surfaces have a preferred planar crystal orientation of (100) and the second crystal axis is one selected from the group consisting of <011> and <0$\bar{1}$1>.

24. The semiconductor device of claim 23 wherein the semiconductor material of the body is one selected from the group consisting of silicon, germanium, silicon carbide and gallium arsenide.

25. The semiconductor device of claim 1 wherein the opposed major surfaces have a preferred planar crystal orientation of (110) and the second crystal axis is <1$\bar{1}$0>.

26. The semiconductor device of claim 25 wherein the material of the body is silicon, silicon carbide, germanium and gallium arsenide.

27. The semiconductor device of claim 1 wherein the opposed major surfaces have a preferred planar crystal orientation of (111) and the second crystal axis is one selected from the group consisting of <01$\bar{1}$>, <10$\bar{1}$>, <1$\bar{1}$0>, <11$\bar{2}$>, <$\bar{2}$11> and <1$\bar{2}$1>.

28. The semiconductor device of claim 27 wherein the material of the body is one selected from the group consisting of silicon, silicon carbide, germanium and gallium arsenide.

* * * * *